United States Patent
Gaknoki

(10) Patent No.: US 8,094,055 B2
(45) Date of Patent: Jan. 10, 2012

(54) COMPACT DIGITAL-TO-ANALOG CONVERTER

(75) Inventor: Yury Gaknoki, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 12/693,991

(22) Filed: Jan. 26, 2010

(65) Prior Publication Data

US 2011/0181453 A1    Jul. 28, 2011

(51) Int. Cl.
*H03M 1/80* (2006.01)

(52) U.S. Cl. ........ 341/153; 341/118; 341/120; 341/144; 341/145

(58) Field of Classification Search ........... 341/144, 341/145, 153, 118, 120
See application file for complete search history.

(56) References Cited

U.S. PATENT DOCUMENTS

| | | | |
|---|---|---|---|
| 5,541,597 A * | 7/1996 | Chi-Mao | 341/118 |
| 6,489,905 B1 * | 12/2002 | Lee et al. | 341/120 |
| 6,650,265 B1 * | 11/2003 | Bugeja | 341/144 |
| 6,703,956 B1 * | 3/2004 | Mueller et al. | 341/145 |
| 6,958,719 B2 * | 10/2005 | Moon | 341/135 |
| 7,026,971 B2 * | 4/2006 | Horsky et al. | 341/145 |
| 7,173,553 B2 * | 2/2007 | Ohmi et al. | 341/145 |
| 7,466,252 B1 * | 12/2008 | Radulov et al. | 341/120 |
| 7,557,743 B2 * | 7/2009 | Imai | 341/144 |
| 7,646,235 B2 * | 1/2010 | Christ | 327/543 |
| 7,764,211 B2 * | 7/2010 | Tokumaru et al. | 341/144 |
| 2005/0035893 A1 * | 2/2005 | Horsky et al. | 341/153 |
| 2006/0061499 A1 * | 3/2006 | Seo | 341/144 |
| 2009/0045993 A1 * | 2/2009 | Tokumaru et al. | 341/136 |

OTHER PUBLICATIONS

Halder et al., "A 30 GS/s 4-Bit Binary Weighted DAC in SiGe BiCMOS Technology," IEEE BCTM 4.1, © 2007, pp. 46-49.

* cited by examiner

*Primary Examiner* — Linh Nguyen
(74) *Attorney, Agent, or Firm* — Blakely Sokoloff Taylor & Zafman LLP

(57) ABSTRACT

A digital-to-analog converter is disclosed. An example digital-to-analog converter circuit includes a reference scaling circuit coupled to receive a first reference current. The reference scaling circuit is coupled to generate a second reference current in response to the first reference current. The digital-to-analog converter circuit also includes a first plurality of binary-weighted current sources coupled to a summing node. A current of a first one of the first plurality of binary-weighted current sources is proportional to the first reference current. The digital-to-analog converter circuit also includes a second plurality of binary-weighted current sources coupled to the summing node. A current of a first one of the second plurality of binary-weighted current sources is proportional to the second reference current.

20 Claims, 6 Drawing Sheets

COMPACT DIGITAL-TO-ANALOG CONVERTER

BACKGROUND INFORMATION

1. Field of the Disclosure

This invention is related to arrangements of transistors within integrated circuits. In particular, the invention is related to the design of digital-to-analog converters that occupy less area on a semiconductor substrate than conventional arrangements.

2. Background

Many integrated circuits perform functions that require the manipulation of both digital and analog signals. For example, the functions of counting, remembering, and timing are often best accomplished with digital signals, whereas sensing, amplifying, and controlling often favor analog signals. In a typical application, an integrated circuit may receive an analog input, convert the input to digital form for processing, and then convert the digital result to an analog output.

The conversion from a digital signal to an analog signal requires a digital-to-analog converter (DAC). A typical DAC in an integrated circuit assigns binary-weighted currents to each digit of a binary number. The individual currents are summed to create an analog current that is proportional to the value of the binary number.

Each binary weighted current is produced by a current source that includes one or more transistors. In conventional designs, the number of transistors in each current source increases exponentially as a power of two as the number of digits increases. Therefore, a DAC for ten bits will typically require more than 1000 transistors for the most basic design, and more than 2000 transistors for applications that require tighter tolerances. A basic DAC for twelve bits will typically require more than 4000 transistors.

A major contributor to the cost of an integrated circuit is the size of the semiconductor die that contains the components. Each transistor occupies a space on the die that cannot be smaller than a minimum area that is a characteristic of the particular process that is used to fabricate the integrated circuit.

An integrated circuit that relies heavily on digital signal processing may contain hundreds of thousands of transistors, so a DAC that uses only a few thousand transistors will not contribute significantly to the size and the cost of the device. However, a small integrated circuit for an application that favors analog signal processing, such as for example a controller for a power supply, cannot include such a large DAC without incurring a significant penalty from an increase in the size and cost. Therefore, it is advantageous to have a compact DAC structure for applications that call for small, low-cost integrated circuits.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
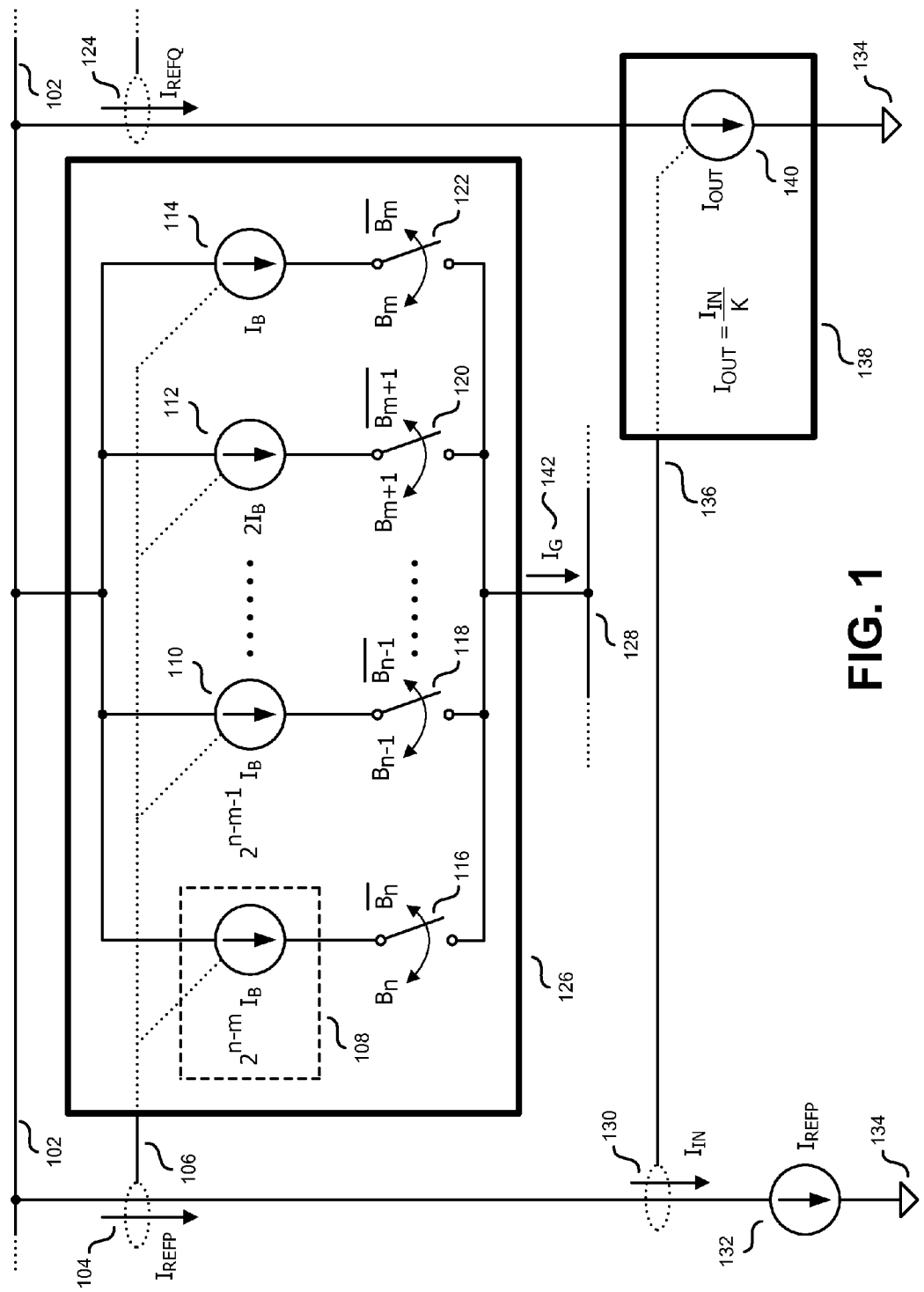
FIG. 1 shows generally a portion of an example compact DAC structure with a scaled current reference in accordance with the teachings of the present disclosure.

Methods and apparatuses for implementing a compact digital-to-analog converter are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, one example of a DAC in accordance with the teachings of the present invention includes a reference scaling circuit that is coupled to receive a first reference signal. In one example, the reference circuit generates a second reference signal that is proportional to, or a scaled version of, the first reference signal. In addition, the DAC includes multiple pluralities (i.e. multiple groups) of binary-weighted current sources that are all coupled to provide current to a summing node. Each of the current sources in the first group generates a current in response to the first reference signal and each of the current sources in the second group generates a current in response to the second reference signal. In one example, since different first and second reference signals are used to generate the currents in the first and second groups of current sources, respectively, the lowest non-zero current of the first group of current sources is greater than the highest current of the second group of current sources. In addition, each of the current sources in the first and second groups is switched in response to a digital input signal. As a result, the total sum of the currents that are provided to the summing node from the first and second groups is responsive to the digital input signal. The analog output signal of the DAC is the total sum of the currents that are provided to the summing node.

To illustrate, FIG. 1 shows generally a portion of an example compact DAC structure with a scaled current reference in accordance with the teachings of the present disclosure. In one example, the example compact DAC structure illustrated in FIG. 1 is included as a portion of a larger electronic circuit, such as for example but not limited to a power supply controller for use in a power supply. In the example of FIG. 1, a reference current $I_{REFP}$ 104 is established by a reference current source 132 that is coupled between voltage source 102 and a return node 134. Reference current $I_{REFP}$ 104 is sensed at a reference node 106 to provide a first reference signal to set the currents of a group of switched binary-weighted current sources 126. As will be discussed, the group of switched binary-weighted current sources 126 is one of multiple groups of current sources in the example compact DAC structure. In the example, the current generated by each current source is generated in response to the first reference signal sensed at reference node 106. In addition, each current source in the group of switched binary-weighed current sources 126 corresponds to one digit of a group of digits of a binary number.

In the example of FIG. 1, the digital input signal of the DAC is a binary signal B including multiple bits, which can be represented as bits 0 through n. In the example illustrated in FIG. 1, the group of binary digits, or bits, includes bits $B_m$ through $B_n$, where m is less than n. Bits $B_m$ through $B_n$ represent a portion of a binary number that has more than n−m+1 digits.

Current sources 108, 110, 112, and 114 in the example of FIG. 1 are coupled between a voltage source 102 and a summing node 128. In the example, the current sources have magnitudes that are weighted by powers of 2 with the lowest magnitude $I_B$ for current source 114, magnitude twice $I_B$ for current source 112, successively doubling the magnitude for each current source such that the current source 108 with the highest magnitude in the group has magnitude $2^{(n-m)}I_B$. In the example of FIG. 1, the value of current $I_B$ is proportional to the reference current $I_{REFP}$ 104.

In the example of FIG. 1, single pole single throw (SPST) switches 116, 118, 120, and 122 coupled to current sources 108, 110, 112, and 114, respectively, are each switched by one of the binary digits $B_m$ through $B_n$. In the example of FIG. 1, a high value for one of the digits closes its respective switch to couple its respective current source to the summing node 128. Conversely, a low value for one of the digits, (which is a high value for the complement of the digit) opens its respective switch to prevent the current from its respective current source from entering the summing node 128. As shown in FIG. 1, a bar over the symbol for a binary digit represents the complement of the binary digit. Therefore, the current $I_G$ 142 that enters node 128 is an analog signal that represents the value of the bits $B_m$ through $B_n$. In the example, the analog output of the DAC is the total sum of all of the currents that are received by summing node 128.

It is appreciated that other examples of compact digital-to-analog converters may include switches with multiple throws, such as for example single pole double throw (SPDT), single pole triple throw (SP3T), or the like, to direct current from the binary-weighted current sources to other nodes for other purposes, such as for example for calibration.

The schematic diagram of FIG. 1 also shows a reference scaling circuit 138 that senses an input current $I_{IN}$ 130, which is representative of reference current $I_{REFP}$ 104, at an input node 136 to set the value of a current source 140 to a value of a scaled output current $I_{OUT}$ that is a fraction of the input current $I_{IN}$ 130. In the example of FIG. 1, reference scaling circuit 138 scales a first reference current $I_{REFP}$ 104 by a scaling factor K to produce a second reference current $I_{REFQ}$ 124, where the scaling factor K is greater than one. Therefore, the second reference current $I_{REFQ}$ 124 is the value of the first reference current $I_{REFP}$ multiplied by the fraction 1/K.

As will be discussed, the second reference current $I_{REFQ}$ 124 used to provide a second reference signal, which is in turn sensed by another group of switched binary-weighted current sources not shown in FIG. 1, but illustrated in the example of FIG. 2.

Figure 2:
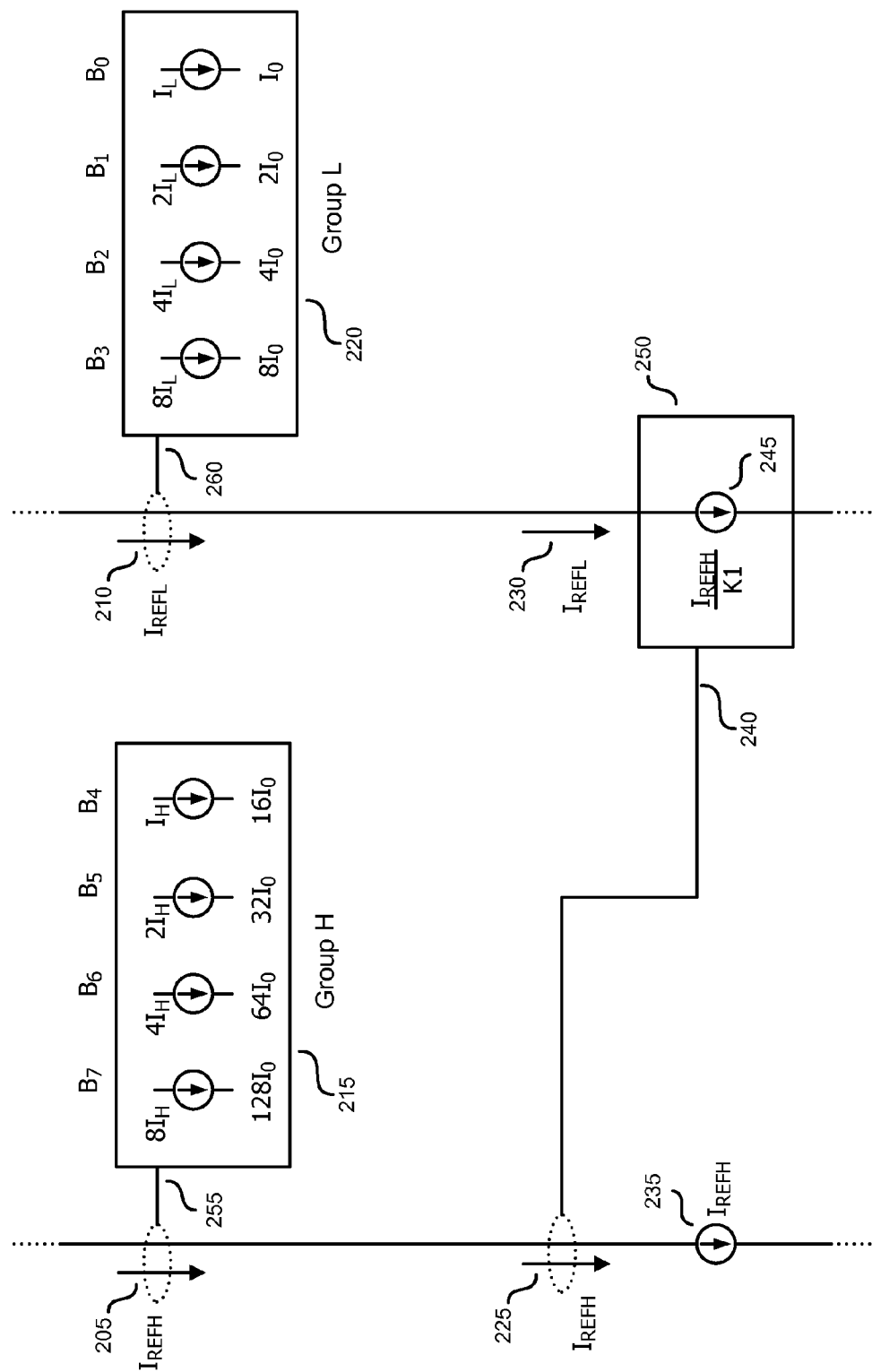
FIG. 2 is a block diagram that illustrates generally the structure of an example compact eight-bit DAC in accordance with the teachings of the present disclosure.

To illustrate, FIG. 2 shows a compact eight bit digital-to-analog converter that includes the structure detailed in the example of FIG. 1. There are two groups of binary-weighted current sources in the example of FIG. 2. Each group includes switched current sources that correspond to the values of four digits of a binary number. Group L 220 corresponds to the lowest four bits $B_0$, $B_1$, $B_2$, and $B_3$, whereas group H 215 corresponds to the highest four bits $B_4$, $B_5$, $B_6$ and $B_7$. The least significant bit Bo is represented by a current $I_0$, whereas the most significant bit $B_7$ is represented by a current that is 128 times ($2^7$ times) the value of $I_0$.

The four binary-weighted current sources in each group have values such that the highest value is eight times the lowest value. The values of the current sources in each group are set by a reference signal for each group. In the example of FIG. 2, a reference current source 235 establishes a reference current $I_{REFH}$ 205 that is sensed at a node 255 to set the currents of the four binary-weighted current sources in group H 215. A reference scaling circuit 250 responds to a sensed input current 225 at an input node 240 to set the value of a current source 245 to a scaled output current $I_{REFL}$ 230 that is a fraction of the reference current $I_{REFH}$ 225. Therefore, the reference signal generated by reference scaling circuit 250 in the example of FIG. 2 is a reference current scaling current.

It is appreciated that in other examples binary-weighted current sources in a group may be responsive to a reference signal that is a voltage reference instead of a current reference. Therefore, the term "reference scaling circuit" in this disclosure may mean any circuit that performs the necessary scaling for a group of the binary-weighted current sources in a compact digital-to-analog converter.

Scaled output current $I_{REFL}$ 230 from reference scaling circuit 250 is the reference current 210 that is sensed at a node 260 to produce the reference signal to set the currents of the four binary-weighted current sources in group L 220. The scaling factor $K_1$ of reference scaling circuit 250 is chosen such that the value of the current source corresponding to the most significant bit in group L 220 ($B_3$) is half the value of the current source corresponding to the least significant bit in group H 215 ($B_4$).

Therefore, the example of FIG. 2 shows a compact digital-to-analog converter including two groups of binary-weighted current sources and one reference scaling circuit, wherein the current of a first binary-weighted current source in a first group of binary-weighted current sources is proportional to a first reference signal current ($I_{REFH}$ 205), the current of a second binary-weighted current source in the second group of binary-weighted current sources is proportional to a second reference signal current ($I_{REFL}$ 210), the first reference current is an input (240) to a scaling circuit (250), and the second reference current is an output of the first reference scaling circuit. Moreover, in the example of FIG. 2, the current from the binary-weighted current source with the lowest current in the first group (corresponding to bit $B_4$) is substantially twice the value of the current from the binary-weighted current source with the highest current in the second group (corresponding to bit $B_3$).

Figure 3:
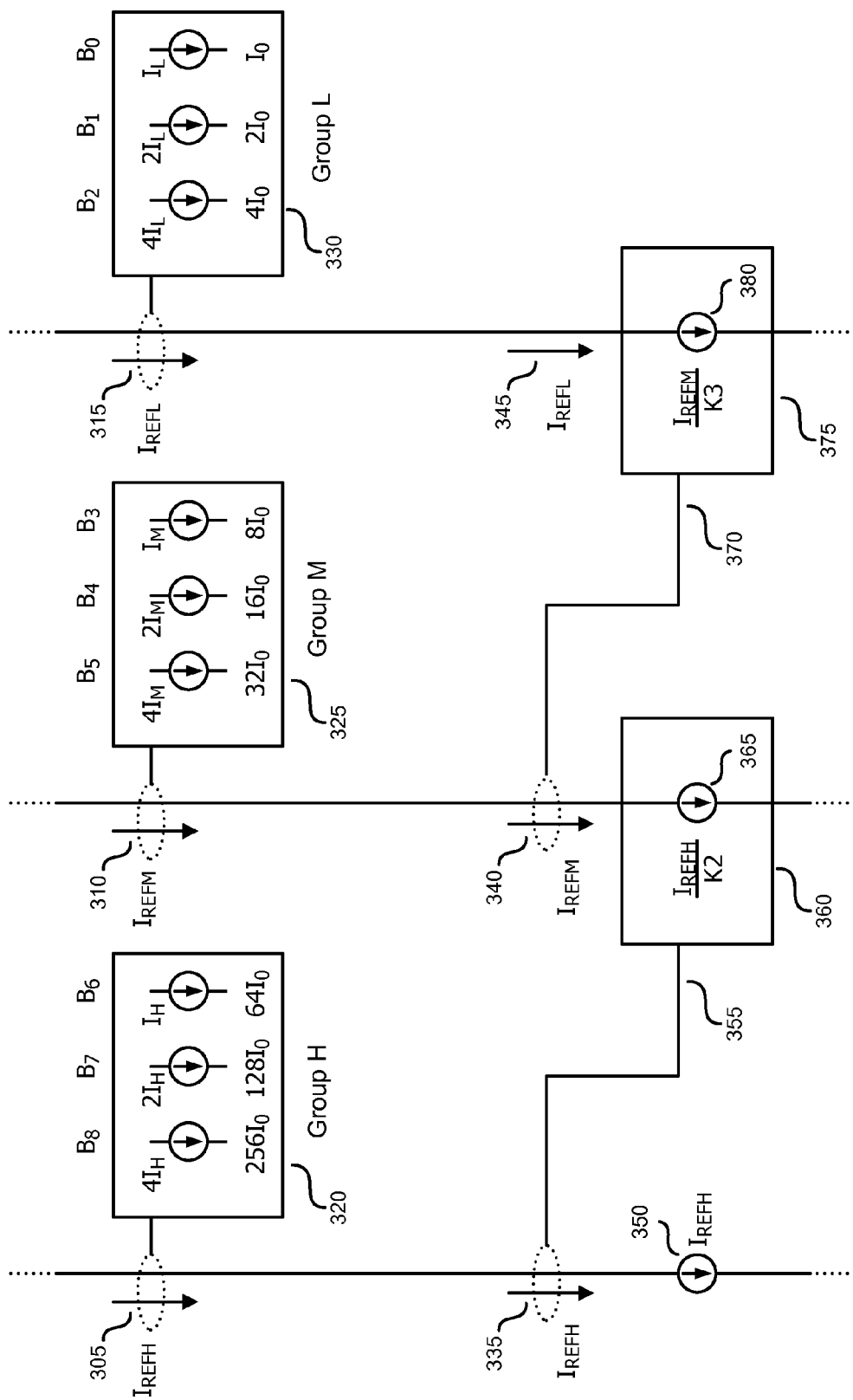
FIG. 3 is a block diagram that illustrates generally the structure of an example compact nine-bit DAC in accordance with the teachings of the present disclosure.

FIG. 3 shows a compact nine bit digital-to-analog converter to further illustrate the structure of the examples in FIG. 1 and FIG. 2. The example nine bit digital-to-analog converter of FIG. 3 has three groups of binary-weighted current sources. Each group includes switched current sources that correspond to the values of three binary digits. Group L 330 corresponds to the lowest three bits $B_0$, $B_1$, and $B_2$. Group M 325 corresponds to the middle three bits $B_3$, $B_4$, and $B_5$, whereas group H 320 corresponds to the highest three bits $B_6$, $B_7$, and $B_8$. The least significant bit $B_0$ is represented by a current $I_0$, whereas the most significant bit $B_8$ is represented by a current that is 256 times the value of $I_0$.

The three binary-weighted current sources in each group have values such that the highest value is four times the lowest value. As in the example of FIG. 2, the values of the current sources in each group are set by a reference current for each group. In the example of FIG. 3, a reference current source 350 establishes a reference current $I_{REFH}$ 305 that sets the currents of the three binary-weighted current sources in group H 320. Reference scaling circuit 360 responds to sensed input current 335 at input node 355 to set the value of current source 365 to a scaled output current $I_{REFM}$ 310 that is a reference current for the three binary-weighted current sources in group M 325. Reference scaling circuit 375 responds to sensed input current 340 at node 370 to set the value of current source 380 to a scaled output current $I_{REFL}$ 345 that is a reference current 315 for the three binary-weighted current sources in group L 330.

In the example of FIG. 3, the scaling factor K2 for scaled output current $I_{REFM}$ 340 from reference scaling circuit 360 is chosen such that the value of the current source corresponding to the most significant bit in group M 325 ($B_5$) is half the value of the current source corresponding to the least significant bit in group H ($B_6$). Similarly, the scaling factor K3 for scaled output current $I_{REFL}$ 345 from reference scaling circuit 375 is chosen such that the value of the current source corresponding to the most significant bit in group L ($B_2$) is half the value of the current source corresponding to the least significant bit in group M ($B_3$).

In other examples, the switched binary-weighted current sources that correspond to individual bits may be grouped in different ways in other examples to achieve specific objectives. For example the nine bit DAC of FIG. 3 might be configured with the highest eight bits in two groups of four bits with the least significant bit $B_0$ in a group by itself. Designers may select the grouping and the scaling factors as appropriate to meet the specifications of the design while conforming to the design rules for a particular integrated circuit technology.

Figure 4:
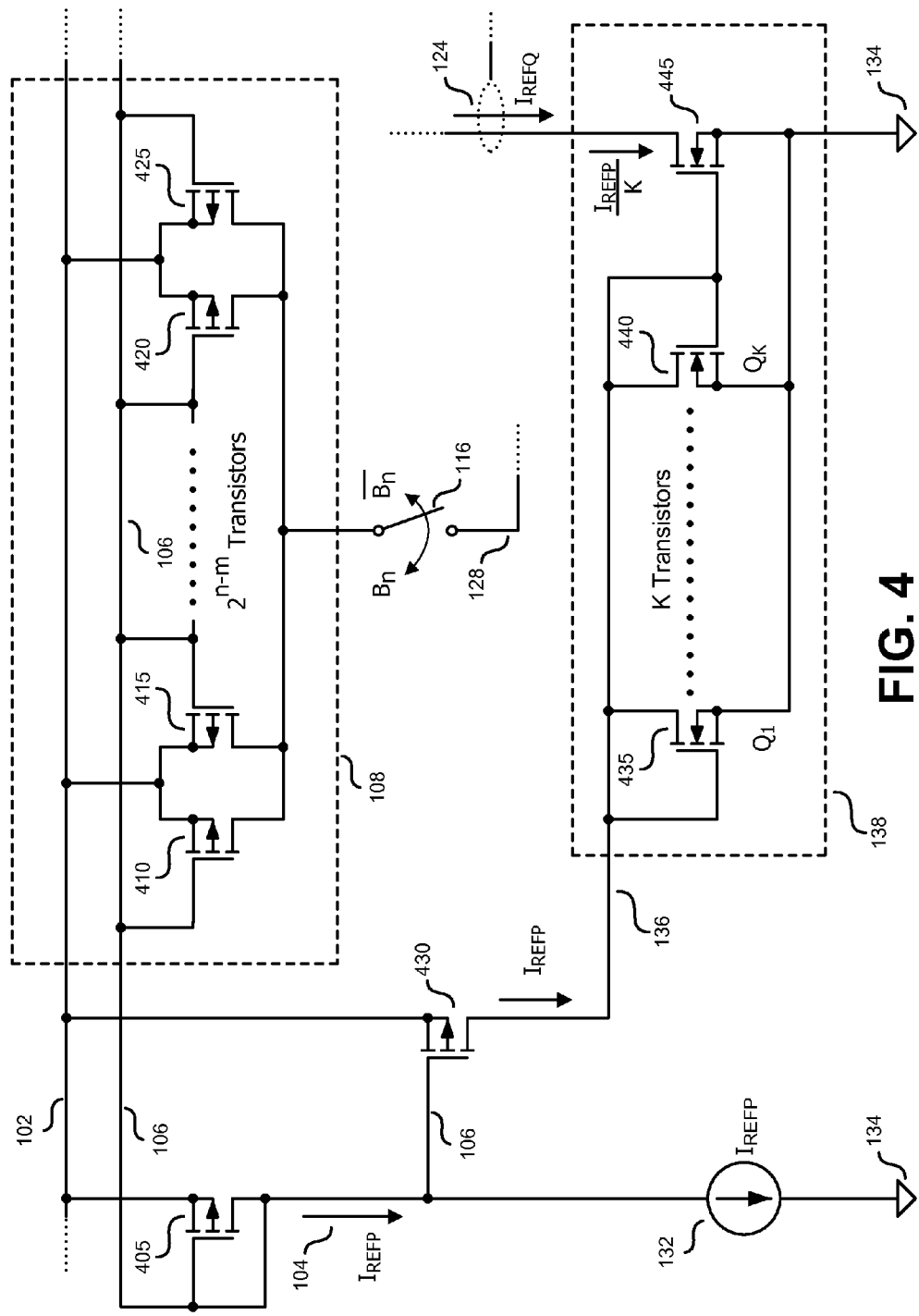
FIG. 4 shows generally an example arrangement of transistors in the compact DAC structure illustrated in FIG. 1 in accordance with the teachings of the present disclosure.

FIG. 4 shows elements of the compact DAC structure of FIG. 1 in greater detail as they may be realized in an integrated circuit. Specifically, possible transistor circuits are shown for binary-weighted current source 108, reference scaling circuit 138, and sensing of reference current $I_{REFP}$ 104.

The example of FIG. 4 shows n-channel and p-channel metal oxide semiconductor field-effect transistors (MOSFETs) coupled as current mirrors to provide the desired values of currents relative to the reference signal generated in response to current source 132. In this disclosure, a reference to a transistor is a transistor of the smallest practical physical dimensions for a particular integrated circuit fabrication process. A transistor structure that has a physical dimension that is a multiple of the smallest practical size is considered to include multiple transistors. For example, a transistor with a channel that is twice the smallest practical width and three times the smallest practical length is equivalent to six transistors of the smallest practical size.

P-channel transistor 405 conducts reference current $I_{REFP}$ 104 to produce a reference signal voltage at reference node 106 that is received at the gates of p-channel transistors 410, 415, 420, and 425. In the example of FIG. 4, p-channel transistors 410, 415, 420, and 425 are four of $2^{n-m}$ transistors that comprise the binary-weighted current source 108. Therefore, the current from the binary-weighted current source 108 is the sum of the currents in each transistor comprising binary-weighted current source 108.

The p-channel transistors of binary-weighted current source 108 are coupled as current mirrors to mirror the current in p-channel transistor 405. Reference current $I_{REFP}$ 104 is thus mirrored into each of the $2^{n-m}$ transistors in the binary-weighted current source 108. When all the p-channel transistors in binary-weighted current source 108 are substantially identical to p-channel transistor 405, the total current from the $2^{n-m}$ transistors in binary-weighted current source 108 is $2^{n-m}$ times the reference current $I_{REFP}$ 104. The same current mirroring technique is typically applied to the other binary-weighted current sources in a group of n-m current sources 126.

FIG. 4 also shows details of an example reference scaling circuit 138. In the example of FIG. 4, p-channel transistor 430 mirrors reference current $I_{REFP}$ 104 from current source 132 into input node 136 of reference scaling circuit 138. Input node 136 is shared by n-channel transistors $Q_1$ 435 and $Q_K$ 440. In the example of FIG. 4, n-channel transistors $Q_1$ and $Q_K$ 440 are two of K transistors that share the current received at input node 136. N-channel transistor 445 in reference scaling circuit 138 is coupled to mirror the current in one of the K transistors sharing the current received at input node 136. Therefore, if all transistors in reference scaling circuit 138 are substantially identical to mirroring transistor 435, the current in transistor 445 of the example reference scaling current 138 of FIG. 4 is the reference current $I_{REFP}$ 104 divided by K. In other words, the reference current $I_{REFP}$ 104 is K times the reference current $I_{REFQ}$ 124. In the example, reference current $I_{REFQ}$ 124 is a second reference signal that is used by another group of binary-weighted current sources.

A conventional eight bit DAC that uses one transistor to mirror current into substantially identical transistors in the current sources for all bits would require 256 transistors (including the mirroring transistor), whereas a compact eight bit DAC that uses the techniques illustrated in FIG. 2 and FIG. 4 would require only 36 substantially identical transistors in accordance with the teachings of the present invention. The computation of 36 transistors is as follows. Substantially identical groups 215 and 220 in the example of FIG. 2 would use 15 transistors each. Current scaling circuit 240 would comprise 3 transistors, and three additional transistors would be required to sense the reference currents. Therefore, the compact eight bit DAC would occupy approximately 14% of the area on the integrated circuit required for the conventional eight bit DAC in accordance with the teachings of the present invention. A similar calculation shows that an example compact twelve bit DAC using the same technique would require only 158 transistors, and would occupy less than 1% of the area required for the conventional twelve bit DAC that would use 4096 transistors in accordance with the teachings of the present invention. Such savings in area can be quite significant in consumer applications that are highly sensitive to cost such as controllers for small power supplies.

Figure 5:
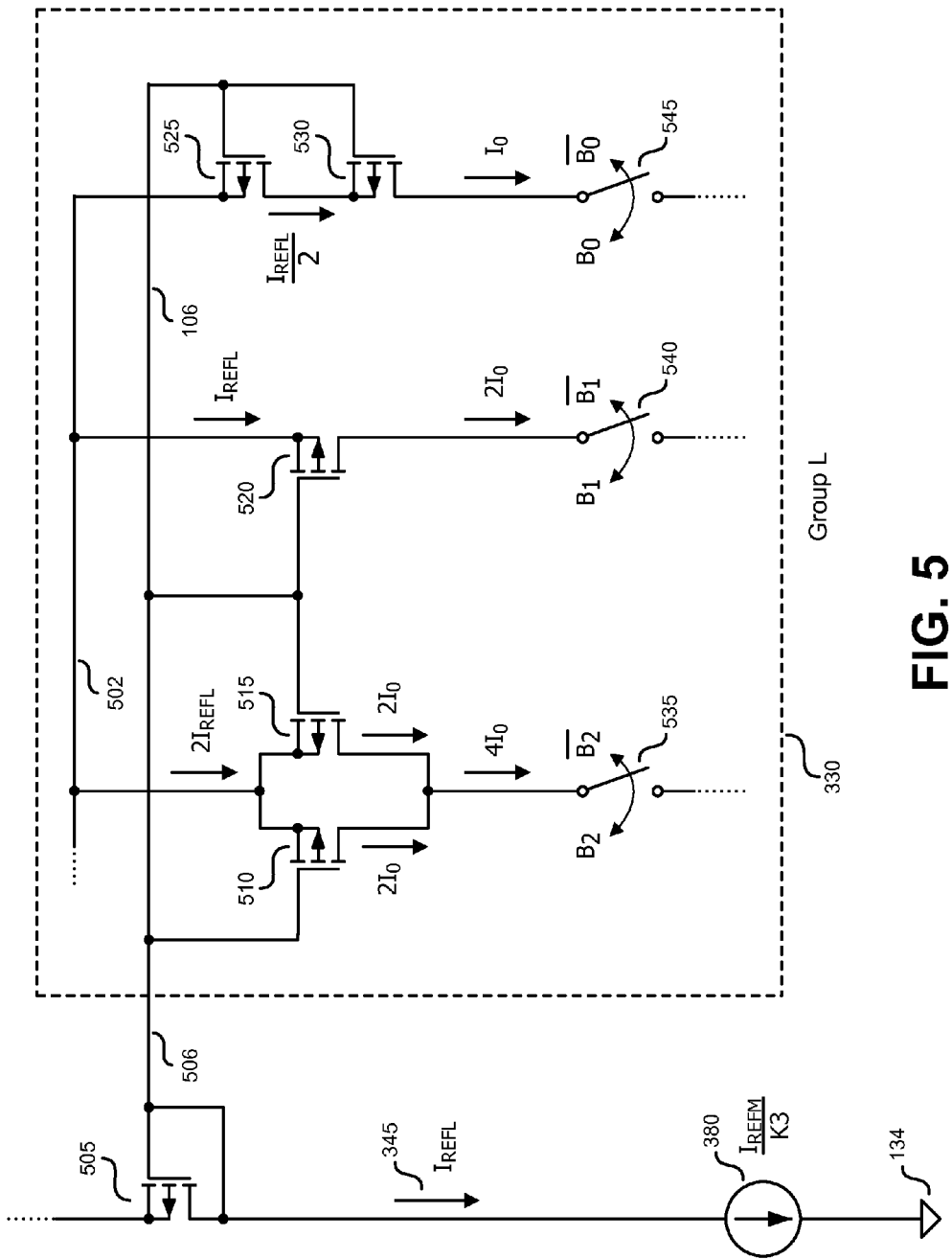
FIG. 5 illustrates generally an example arrangement of transistors for binary-weighted current sources in a compact DAC structure in accordance with the teachings of the present disclosure.

FIG. 5 shows details of an arrangement of transistors for a group of binary-weighted current sources that can further reduce the area required on an integrated circuit for a digital-to-analog converter. FIG. 5 shows the transistors comprising the current sources in the group of lowest significant bits 330 in the example of FIG. 3. In the example of FIG. 5, p-channel transistor 505 conducts reference current $I_{REFL}$ 345 to produce a reference signal voltage at reference node 506 that is received at the gates of p-channel transistors 510, 515, 520, 525 and 530.

In the example of FIG. 5, the sources of p-channel transistors 510, 515, 520, and 525 are coupled to a voltage source 502. In the example of FIG. 5, the drains of p-channel transistors 510 and 515 are coupled to switch 535, whereas the drains of p-channel transistors 520 and 530 are coupled respectively to switches 540 and 545.

When all transistors in the group of binary-weighted current sources 330 are substantially identical to the mirroring transistor 505, reference current $I_{REFL}$ 345 is mirrored into transistors 510, 515, and 520. However, in the series arrangement of transistors 525 and 530 with both gates common to reference node 506, only half the reference current $I_{REFL}$ 345 is mirrored into transistors 525 and 530. Therefore, a group of binary-weighted current sources that has transistors in series to mirror current for the least significant bit and either a single transistor or transistors in parallel to mirror current for more significant bits can use fewer transistors than a group that uses a single transistor to mirror current for the least significant bit in accordance with the teachings of the present invention.

Figure 6:
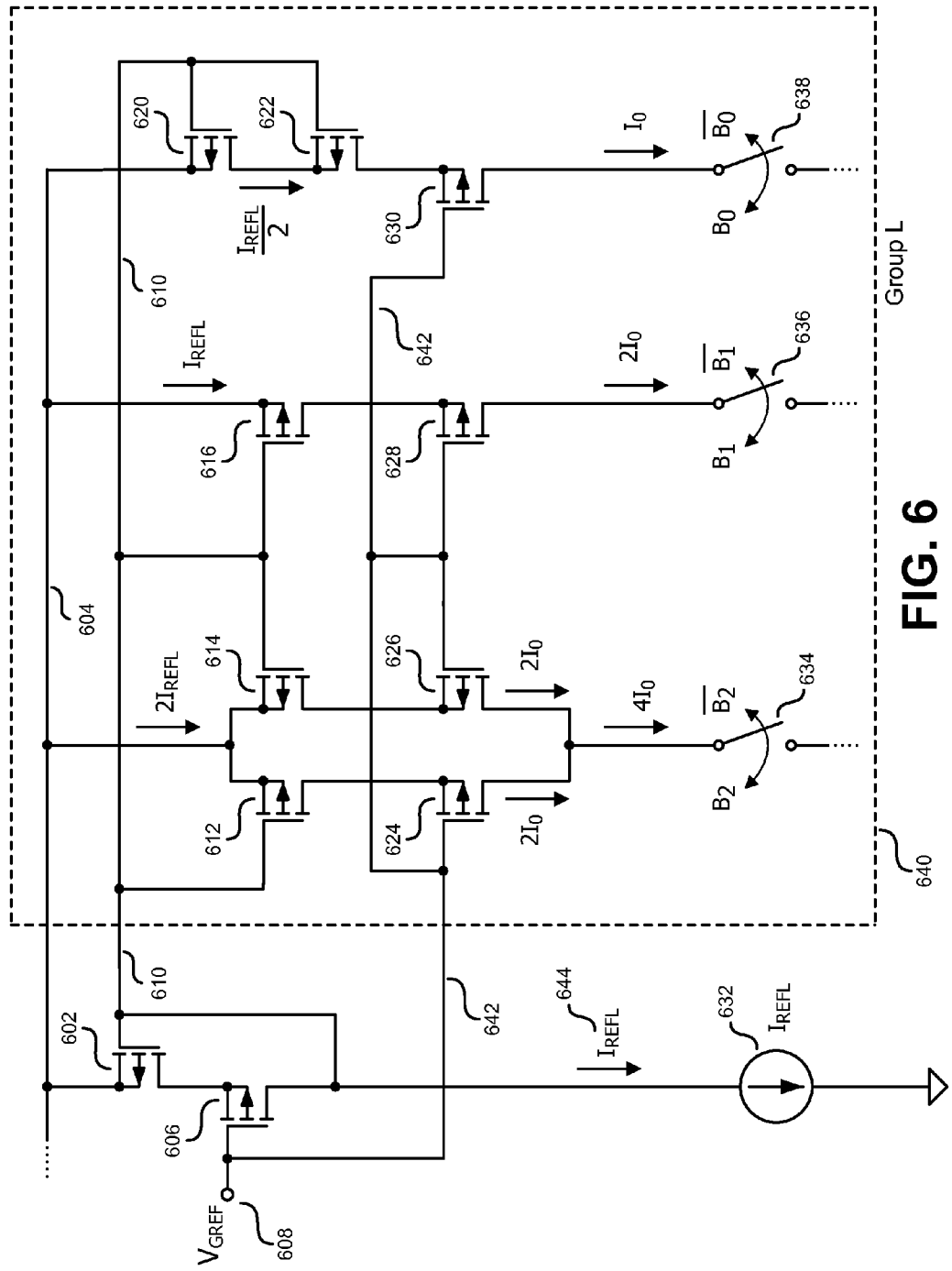
FIG. 6 shows generally an alternative example arrangement of transistors for binary-weighted current sources in a compact DAC structure in accordance with the teachings of the present disclosure.

In some examples, it is desirable to use two transistors coupled in a cascode arrangement instead of a single transistor in current mirrors for current sources, particularly when the current sources are switched as in digital-to-analog converters. In the illustrated example, the current sources with cascode coupled transistors have a higher output impedance than a single-transistor current source. High output impedance is desirable for a current source because the output impedance of an ideal current source is infinite. FIG. 6 illustrates a variant of the example of FIG. 5 that applies cascode coupled transistors to mirror a reference current.

The example of FIG. 6 shows how the example of FIG. 5 may be modified with cascode coupled transistors. The example of FIG. 6 shows a group of switched binary-weighted current sources 640 that corresponds to the three lowest bits of a compact digital-to-analog converter. In the example of FIG. 6, the gates of p-channel transistors 606, 624, 626, 628, and 630 are coupled to a common node 642 that is held at a substantially constant reference voltage $V_{GREF}$ 608. Cascode coupled transistors 606 and 602 conduct reference current $I_{REFL}$ 644 from current source 632 to produce a voltage at reference node 610 that is received at the gates of p-channel transistors 612, 614, 616, 620, and 622.

In the example of FIG. 6, the sources of p-channel transistors 602, 612, 614, 616, and 620 are coupled to a voltage source 604. In the example of FIG. 6, the drains of p-channel transistors 624 and 626 are coupled to switch 634, whereas the drains of p-channel transistors 628 and 630 are coupled respectively to switches 636 and 638.

As in the example of FIG. 5, when all transistors in the group of binary-weighted current sources 640 in the example of FIG. 6 are substantially identical to the mirroring transistor 602, reference current $I_{REFL}$ 644 is mirrored into transistors 612, 614, and 616. However, the series arrangement of transistors 620 and 622 with both gates common to reference node 610 mirrors only half the reference current $I_{REFL}$ 644 into transistors 620 and 622.

Therefore, a group of binary-weighted current sources that has two transistors in series to mirror current for the least significant bit and either a single transistor or transistors in parallel to mirror current for more significant bits can use fewer transistors than a group that uses a single transistor to mirror current for the least significant bit, even when the current sources are coupled in a cascode arrangement.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A digital-to-analog converter circuit, comprising:
a reference scaling circuit coupled to receive a first reference current, the reference scaling circuit coupled to generate a second reference current in response to the first reference current;
a first plurality of binary-weighted current sources coupled to a summing node, wherein a current of a first one of the first plurality of binary-weighted current sources is proportional to the first reference current, wherein a current of a second one of the first plurality of binary-weighted current sources is substantially equal to twice the current of the first one of the first plurality of binary-weighted current sources; and
a second plurality of binary-weighted current sources coupled to the summing node, wherein a current of a first one of the second plurality of binary-weighted current sources is proportional to the second reference current, wherein a current of a second one of the second plurality of binary-weighted current sources is substantially equal to twice the current of the first one of the second plurality of binary-weighted current sources.

2. The digital-to-analog converter circuit of claim 1 wherein a current from one of the first plurality of binary-weighted current sources is substantially equal to twice a current from one of the second plurality of binary-weighted current sources.

3. The digital-to-analog converter circuit of claim 1 wherein the first and second pluralities of binary-weighted current sources comprise a plurality of transistors.

4. The digital-to-analog converter circuit of claim 1 wherein the first and second pluralities of binary-weighted current sources comprise a plurality of current mirror circuits.

5. The digital-to-analog converter circuit of claim 1 wherein one of the first or second plurality of binary-weighted current sources includes a plurality of transistors coupled to the summing node, wherein a current generated by said one of the plurality of binary-weighted current sources is a sum of individual currents from each of said plurality of transistors coupled to the summing node.

6. The digital-to-analog converter circuit of claim 1 wherein a first one of the first or second plurality of binary-weighted current sources has a lowest current of said first or second plurality of binary-weighted current sources, wherein a second one of said first or second plurality of binary-weighted current sources has a second lowest current of said first or second plurality of binary-weighted current sources, wherein the first one of said first or second plurality of binary-weighted current sources comprises at least twice as many transistors as said second one of the first or second plurality of binary-weighted current sources.

7. The digital-to-analog converter circuit of claim 1 wherein a first one of the first or second plurality of binary-weighted current sources has a lowest current of said first or second plurality of binary-weighted current sources, wherein a second one of said first or second plurality of binary-weighted current sources has a second lowest current of said first or second plurality of binary-weighted current sources, wherein the first one of said first or second plurality of binary-weighted current sources comprises more transistors than the second one of said first or second plurality of binary-weighted current sources.

8. The digital-to-analog converter circuit of claim 1 wherein the digital-to-analog converter circuit is included in a power supply controller.

9. The digital-to-analog converter circuit of claim 1 wherein the first and second pluralities of binary-weighted current sources are coupled to be responsive to a digital input signal and wherein a sum of current received by the summing node is an analog output signal proportional to the digital input signal.

10. The digital-to-analog converter circuit of claim 9 wherein the first and second pluralities of binary-weighted current sources are switched in response to the digital input signal.

11. A digital-to-analog converter circuit, comprising:
a first reference scaling circuit coupled to receive a first reference signal and coupled to generate a second reference signal that is proportional to the first reference signal;
a first plurality of binary-weighted current sources coupled to a summing node, wherein each of the first plurality of binary-weighted current sources is coupled to receive the first reference signal and generate a respective current in response to the first reference signal, wherein the respective current of a second one of the first plurality of binary-weighted current sources is substantially equal to twice the respective current of a first one of the first plurality of binary-weighted current sources;
a second plurality of binary-weighted current sources coupled to the summing node, wherein each of the second plurality of binary-weighted current sources is coupled to receive the second reference signal and generate a respective current in response to the second reference signal, wherein the respective current of a second one of the second plurality of binary-weighted current sources is substantially equal to twice the respective current of a first one of the second plurality of binary-weighted current sources; and
first and second pluralities of switches, each one of the first and second pluralities of switches coupled to a respective one of the first and second pluralities of binary-weighted current sources, wherein the first and second pluralities of switches are coupled to be switched in response to a digital input signal, wherein the summing node is coupled to receive respective currents from each one of the first and second pluralities of binary-weighted current sources in response to the digital input signal such that a sum of the respective currents received by the summing node is responsive the digital input signal.

12. The digital-to-analog converter circuit of claim 11 further comprising:
a second reference scaling circuit coupled to generate a third reference signal proportional a third plurality of binary-weighted current sources coupled to the summing node, wherein each of the third plurality of binary-weighted current sources is coupled to receive the third reference signal and generate a respective current in response to the third reference signal.

13. The digital-to-analog converter circuit of claim 11 wherein a lowest non-zero current from one of the first plurality of binary-weighted current sources is greater than a highest current from one of the second plurality of binary-weighted current sources.

14. The digital-to-analog converter circuit of claim 11 wherein a lowest non-zero current from one of the first plurality of binary-weighted current sources is substantially equal to twice a highest current from one of the second plurality of binary-weighted current sources.

15. The digital-to-analog converter circuit of claim 11 wherein the first and second pluralities of binary-weighted current sources comprise current mirror circuits coupled to the summing node.

16. The digital-to-analog converter circuit of claim 15 wherein the current minor circuits comprise a cascode arrangement of transistors coupled to the summing node.

17. The digital-to-analog converter circuit of claim 11 wherein a first one of the first or second plurality of binary-weighted current sources has a lowest current of said first or second plurality of binary-weighted current sources, wherein a second one of said first or second plurality of binary-weighted current sources has a second lowest current of said first or second plurality of binary-weighted current sources, wherein the first one of the first or second plurality of binary-weighted current sources comprises more transistors than the second one of the first or second plurality of binary-weighted current sources.

18. The digital-to-analog converter circuit of claim 17 wherein the first one of the first or second plurality of binary-weighted current sources comprises a series arrangement of transistors having commonly coupled gate terminals.

19. The digital-to-analog converter circuit of claim 11 wherein the first plurality of binary-weighted current sources comprise:
a first current source including a first transistor and a second transistor coupled in series between a voltage source and the summing node, the first and second transistors having gate terminals coupled to receive the first reference signal;
a second current source including a third transistor coupled between the voltage source and the summing node; the third transistor having a gate terminal coupled to receive the first reference signal; and
a third current source including a fourth transistor and a fifth transistor coupled in parallel between the voltage source and the summing node, the fourth and fifth transistors having gate terminals coupled to receive the first reference signal.

20. The digital-to-analog converter circuit of claim 19 wherein the first current source includes a first cascode transistor coupled between the second transistor and the summing node, wherein the second current source includes a second cascode transistor coupled between the third transistor and the summing node, and wherein the third current source includes a third cascode transistor coupled between the fourth transistor and the summing node, and a fourth cascode transistor coupled between the fifth transistor and the summing node.

* * * * *

UNITED STATES PATENT AND TRADEMARK OFFICE
CERTIFICATE OF CORRECTION

PATENT NO.       : 8,094,055 B2                                Page 1 of 1
APPLICATION NO.  : 12/693991
DATED            : January 10, 2012
INVENTOR(S)      : Yury Gaknoki It is certified that error appears in the above-identified patent and that said Letters Patent is hereby corrected as shown below:

In the Claims

Column 9, line 69 (claim 12), "third reference signal proportional" should read --third reference signal proportional to the first reference signal; and--.

Column 10, line 22 (claim 16), "minor" should read --mirror--.

Signed and Sealed this
Thirty-first Day of March, 2015

Michelle K. Lee
*Director of the United States Patent and Trademark Office*